(12) United States Patent
Epitaux et al.

(10) Patent No.: US 6,864,553 B2
(45) Date of Patent: Mar. 8, 2005

(54) METHOD AND APPARATUS FOR A BACKSIDED AND RECESSED OPTICAL PACKAGE CONNECTION

(75) Inventors: Marc Epitaux, Sunnyvale, CA (US); Peter E. Kirkpatrick, Berkeley, CA (US); Jean-Marc Verdiell, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 10/209,368

(22) Filed: Jul. 30, 2002

(65) Prior Publication Data

US 2004/0021217 A1 Feb. 5, 2004

(51) Int. Cl.$^7$ .......................................... H01L 31/0203
(52) U.S. Cl. ...................... 257/433; 257/693; 257/704; 257/432; 257/434; 257/435
(58) Field of Search ................................ 257/432–435, 257/704, 693

(56) References Cited

U.S. PATENT DOCUMENTS 4,839,716 A * 6/1989 Butt ........................... 257/660
5,311,007 A * 5/1994 Kato ........................ 250/208.1

* cited by examiner

Primary Examiner—Luan Thai
(74) Attorney, Agent, or Firm—Blakely, Sokoloff, Taylor & Zafman LLP

(57) ABSTRACT

A method and apparatus for a backsided and recessed optical package connection is described. The method includes the formation of a substrate having a top surface layer and an opposed layer, including one or more recessed portions. Following formation of the substrate, leads of a lead unit are coupled to one or more of the recessed portions of the substrate. Next, one or more optical electronic components are mounted onto the top surface of the substrate. Once the optoelectric components are mounted to the top surface of the substrate, a cap is attached to the top surface of the substrate to encapsulate the one or more optical electronic components and form an optoelectronic package.

16 Claims, 13 Drawing Sheets

OPTICAL PACKAGE (BACKSIDE VIEW) 200

OPTICAL PACKAGE (TOP SIDE VIEW) 200

MINI-DIL 2.5Gb/s TRANSMITTER 150

BUTTERFLY CAN 10Gb/s TRANSMITTER 100

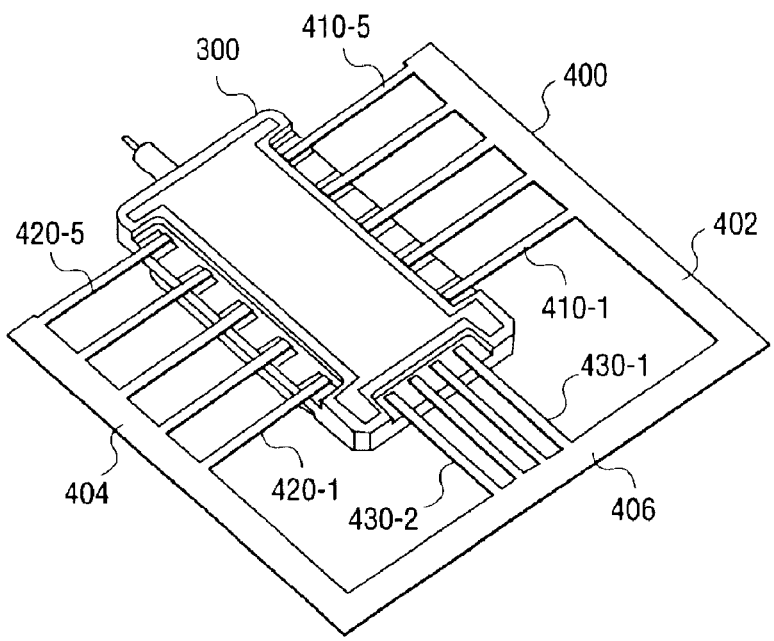
FIG. 3  OPTICAL PACKAGE (BACKSIDE VIEW) 200
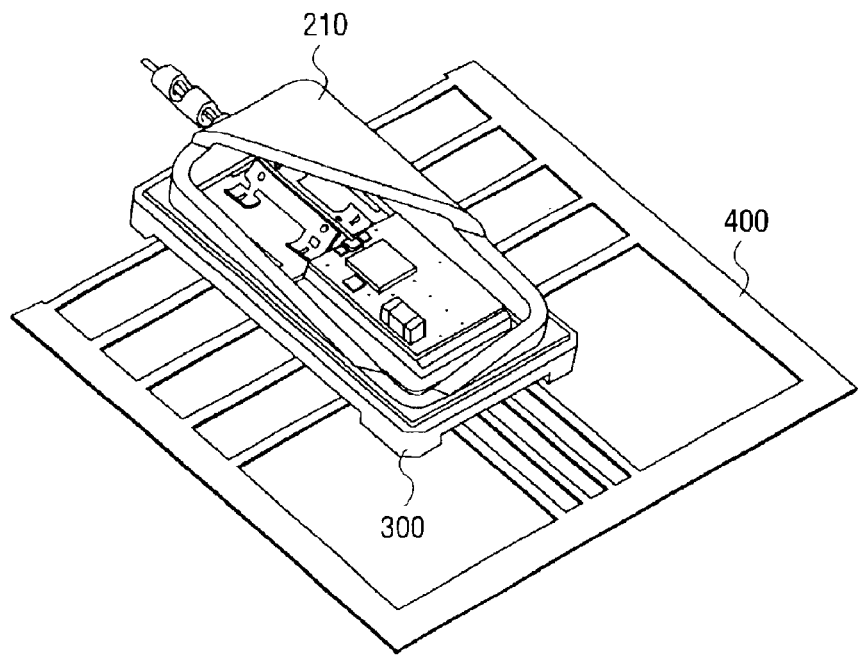
FIG. 4  OPTICAL PACKAGE (TOP SIDE VIEW) 200

SUBSTRATE RF SIGNAL PATH LAYER 330

CUTAWAY VIEW OF MTx (MINI TRANSMITTER) 500

METHOD AND APPARATUS FOR A BACKSIDED AND RECESSED OPTICAL PACKAGE CONNECTION

FIELD OF THE INVENTION

One or more embodiments of the present invention relate generally to optoelectronics. In particular, one embodiment of the present invention relates to an apparatus and method for a backsided and recessed optical package connection.

BACKGROUND OF THE INVENTION

Optoelectronics is a field of technology that combines the physics of light with the principles of electricity. Currently, various integrated circuits (IC) design techniques utilize the physics of electricity to provide a vast array of devices for implementing computer systems, wireless technology, imaging systems, media systems and the like. Unfortunately, IC design techniques are dangerously close to reaching a reliable, upper limit of bandwidth available for data transmission via metal wires. As a result, the field of optoelectronics is focused on bridging the gap between the knowledge base held by IC chip designers in order to utilize unlimited bandwidth provided by the physics of light.

Optoelectronic technologies include, for example, fiber optic communications, laser systems, electronic eyes/machine vision, remote sensing systems, medical diagnostic systems and optical information systems. In fact, the field of fiber optics is of particular interest in view of the dynamic growth of the Worldwide Web (Internet). The promise provided by the Internet of one day connecting each individual throughout the world via computer screens and mouse clicks becomes a reality when viewed through the eyes of the optoelectronic engineer. Specifically, fiber optics provides the capability of vastly increasing the bandwidth available from the Internet in order to make communication, as well as a worldwide marketplace, a reality for tomorrow's consumers.

As known to those skilled in the art, fiber optics utilizes glass (or plastic) threads (fibers) to transmit data. The fiber optic cable consists of a bundle of glass threads, each of which is capable of transmitting messages modulated onto light waves. As a result, fiber optics includes several advantages over traditional communications techniques. Specifically, fiber optic cables provide substantially greater bandwidth than conventional metal wires. In addition, fiber optic cables are less susceptible to interference and are much thinner and lighter than coax cables or metal wires utilized by current communications technologies.

Consequently, in order to utilize the expansive bandwidth provided by fiber optics, it is necessary to utilize devices which can perform optical to electric, as well as electric to optical transduction. This conversion is necessary in order to interface with existing electrical systems, which utilize IC chips for processing received data. Although integrated devices one day will be able to process directly optical signals, fiber optics is dependent on efficient devices for performing optical to electrical, as well as electrical to optical transduction in order to interface with legacy electronic system.

Accordingly, optoelectronics is focused on the study, design and manufacture of hardware devices that convert electrical signals into photon signals, as well as converting photon signals into electrical signals. Although various devices exist for performing optical transduction, the current technology standard is the butterfly/can package. These cans may have a coaxial radio frequency interface or ceramic leaded interface. An additional package is the dual in-line (MINI-DIL) package, which is a ceramic can with ceramic walls and vertical leads.

Unfortunately, devices such as the butterfly, as well as the MINI-DIL package are configured according to a can shape, including various sidewalls. As a result, these devices are not capable of providing a planar platform to perform optical assemblies, including optical transducers, transponders or the like. Moreover, the configuration of such devices does not enable product fabrication utilizing such techniques as machine vision or electric eyes. In addition, current tooling techniques for modification and assembly, as well as fabrication utilizing optical packages are ineffective when working with such can package configurations. Therefore, there remains a need to overcome one or more of the limitations in the above-described, existing art.

BRIEF DESCRIPTION OF THE DRAWINGS

The features, aspects, and advantages of the various embodiments of the present invention will become more fully apparent from the following detailed description and appended claims when taken in conjunction with accompanying drawings in which:

FIG. 3 depicts a block diagram illustrating backsided recess optical package in accordance with one embodiment of the present invention.

FIG. 4 depicts a block diagram illustrating a top surface of the optical package connection depicted in FIG. 3, in accordance with a further embodiment of the present invention.

DETAILED DESCRIPTION

Figure 2:
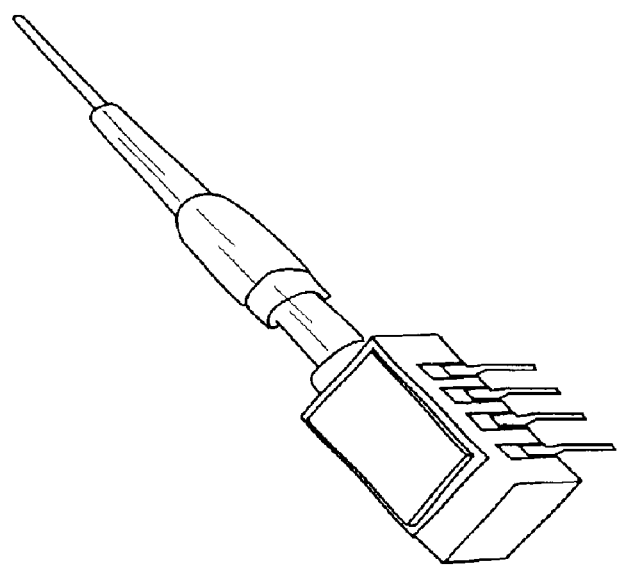
FIG. 2 depicts a block diagram illustrating a MINI-DWL transmitter, as known in the art.

A method and apparatus for a backsided and recessed optical package connection are described. In one embodiment, the method includes the formation of a substrate having a top surface layer and an opposed layer, including one or more recessed portions. Following formation of the substrate, leads of a lead unit are coupled to one or more of the recessed portions of the substrate. Next, one or more optical electronic components are mounted onto the top surface of the substrate. Once the optoelectric components are mounted to the top surface of the substrate, a cap is attached to the top surface of the substrate to encapsulate the one or more optical electronic components and form an optoelectronic package.

In the following description, for the purposes of explanation, numerous specific details are set forth in order to provide a thorough understanding of the various embodiments of the present invention. It will be apparent, however, to one skilled in the art that the various embodiments of the present invention may be practiced without some of these specific details. In addition, the following description provides examples, and the accompanying drawings show various examples for the purposes of illustration. However, these examples should not be construed in a limiting sense as they are merely intended to provide examples of the various embodiments of the present invention rather than to provide an exhaustive list of all possible embodiments of the present invention. In other instances, well-known structures and devices are shown in block diagram form in order to avoid obscuring the details of the various embodiments of the present invention.

Portions of the following detailed description may be presented in terms of algorithms and symbolic representations of operations on data bits. These algorithmic descriptions and representations are used by those skilled in the data processing arts to convey the substance of their work to others skilled in the art. An algorithm, as described herein, refers to a self-consistent sequence of acts leading to a desired result. The acts are those requiring physical manipulations of physical quantities. These quantities may take the form of electrical or magnetic signals capable of being stored, transferred, combined, compared, and otherwise manipulated. Moreover, principally for reasons of common usage, these signals are referred to as bits, values, elements, symbols, characters, terms, numbers, or the like.

However, these and similar terms are to be associated with the appropriate physical quantities and are merely convenient labels applied to these quantities. Unless specifically stated otherwise, it is appreciated that discussions utilizing terms such as "processing" or "computing" or "calculating" or "determining" or displaying" or the like, refer to the action and processes of a computer system, or similar electronic computing device, that manipulates and transforms data represented as physical (electronic) quantities within the computer system's devices into other data similarly represented as physical quantities within the computer system devices such as memories, registers or other such information storage, transmission, display devices, or the like.

The algorithms and displays presented herein are not inherently related to any particular computer or other apparatus. Various general purpose systems may be used with programs in accordance with the embodiments herein, or it may prove convenient to construct more specialized apparatus to perform the required methods. For example, any of the methods according to the various embodiments of the present invention can be implemented in hard-wired circuitry, by programming a general-purpose processor, or by any combination of hardware and software.

One of skill in the art will immediately appreciate that the various embodiments of the invention can be practiced with computer system configurations other than those described below, including hand-held devices, multiprocessor systems, microprocessor-based or programmable consumer electronics, digital signal processing (DSP) devices, network PCs, minicomputers, mainframe computers, and the like. The various embodiments of the invention can also be practiced in distributed computing environments where tasks are performed by remote processing devices that are linked through a communications network. The required structure for a variety of these systems will appear from the description below.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression.

Thus, one skilled in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

In an embodiment, the methods of the present invention are embodied in machine-executable instructions. The instructions can be used to cause a general-purpose or special-purpose processor that is programmed with the instructions to perform the methods of the present invention. Alternatively, the methods of the present invention might be performed by specific hardware components that contain hardwired logic for performing the methods, or by any combination of programmed computer components and custom hardware components to enable circuit design automation, software for implementing hardware tasks, or the like.

In one embodiment, the present invention may be provided as a computer program product which may include a machine or computer-readable medium having stored thereon instructions which may be used to program a computer (a system or other electronic devices) to perform a process according to the present invention. The computer-readable medium may include, but is not limited to, floppy diskettes, optical disks, Compact Disc, Read-Only Memory (CD-ROMs), and magneto-optical disks, Read-Only Memory (ROMs), Random Access Memory (RAMs), Erasable Programmable Read-Only Memory (EPROMs), Electrically Erasable Programmable Read-Only Memory (EEPROMs), magnetic or optical cards, flash memory, or the like.

Conventional Optical Transmitters

As described above, integrated circuit (IC) design techniques are dangerously close to reaching an upper limit of bandwidth available for data transmission via metal wires. However, in order for continued growth of communication technologies, such as wireless communications, as well as Internet access via the Worldwide Web, additional bandwidth for communication and exchange of data is at a premium. Consequently, technologies such as optoelectronics are focused on bridging the gap between the vast information base developed from IC chip circuit design and applying such design techniques to the physics of light in order to form optoelectronic devices to enable high bandwidth data communication.

One field of particular interest within optoelectronics is fiber optics. The field of fiber optics is of particular interest, since fiber optics provides the capability of vastly increasing the bandwidth available for communications of data. As described above, fiber optics utilizes glass (or plastic) threads (fibers) to transmit data. As a result, fiber optic cables provides substantially greater bandwidth then conventional metal wires or coax cables. In addition, fiber optic cables are less susceptible to interference and are much thinner and lighter than coax cables or metal lines utilized by current communications technologies.

Consequently, in order to utilize the expansive bandwidth provided by fiber optics, it is necessary to utilizes devices which can perform optical to electric, as well as electrical to optic transduction. This optical/electrical conversion is necessary in order to utilize communications networks which will combine fiber optics communication, as well as integrated circuits, to continue processing of data. Until optical switching networks are designed, which are both cost effective and efficient, it is necessary to provide efficient devices for optical electrical transduction.

Figure 1:
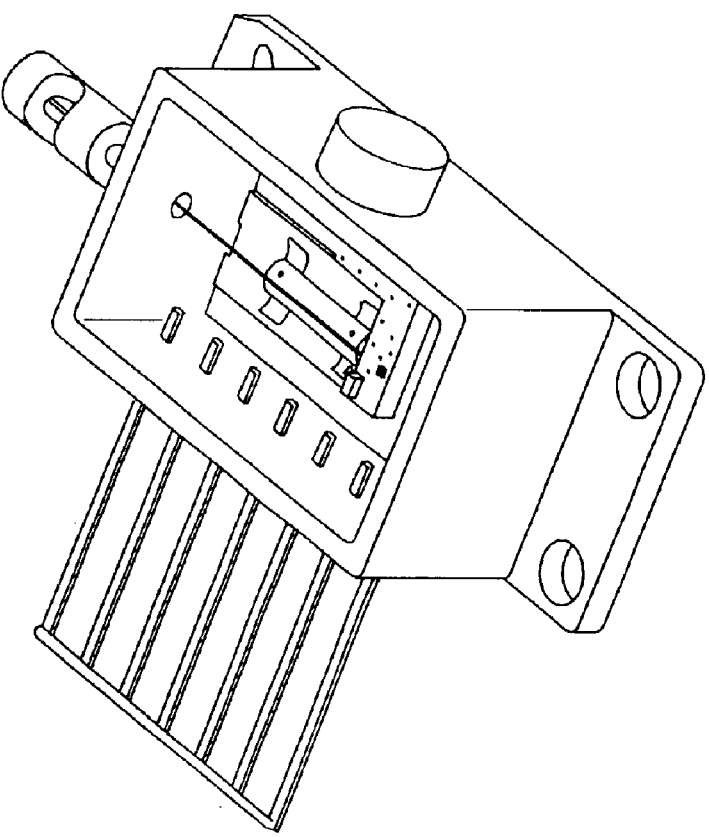
FIG. 1 depicts a block diagram depicting a butterfly/can optical transmitter, as known in the art.

Referring now to FIG. 1, FIG. 1 depicts a block diagram illustrating a butterfly/can transmitter 100, as known in the art. The butterfly/can transmitter 100 is utilized in order to convert electrical signals into optical signals and transmit the optical signals to an optical receiver. A further package for transmitting of optical signals generated from electrical signals is the dual-inline (MINI-DIL) transmitter 150, as depicted in FIG. 2. The MINI-DIL transmitter 150, as depicted in FIG. 2, is also utilized in order to couple to a printed circuit board (PCB) and convert electrical signals from the printed circuit board into optical signals and transmit the optical signals via an optical cable coupled to the MINI-DIL transmitter 150.

Unfortunately, both the butterfly/can transmitter 100, as well as the MINI-DIL transmitter 150 are configured according to a can shape including various sidewalls. As a result of the various transmitter configurations, these devices are not capable of providing a planar platform to perform optical package assemblies, including optical transducers, transponders, transmitters, receivers or the like. Moreover, the configuration of the transmitters depicted in FIGS. 1 and 2, do not enable product fabrication utilizing such techniques as machine vision or electric eyes. In addition, current tooling techniques for modification and assembly, as well as fabrication utilizing optical package connections are ineffective in working with such can package configurations.

Optical Package Configuration

Accordingly, as depicted with reference to FIG. 3, one embodiment of the present invention describes a backside recessed, optical package connection. As illustrated, the optical package 200 includes a lead frame 400, which is coupled to recessed portions of an optical package substrate 300. The recessed portions of the optical package substrate are further depicted with reference to FIGS. 5–6D. Accordingly, as illustrated, a backside surface of the optical package connection 200 includes recessed portions, which enable couplings of the leads 410, 420 and 430 of a lead frame 400 in order to reduce the air gap between the lead frame and a PCB.

Accordingly, as illustrated with reference to FIG. 3, the optical package connection 200 includes a recessed, intermediate layer for attaching the leads of lead frame 400, which couples the optical package 200 to a PCB for receiving electrical signals. As illustrated, the recessed configuration of optical package 200 increases the space available for mounting optoelectronic components to a top surface of the package 200. In addition, the recessed configuration provides a flat surface on a backside of the optical package 200, which improves thermal dissipation. Moreover, the recessed package configuration increases available system space by eliminating coaxial connections.

Referring now to FIG. 4, FIG. 4 illustrates a top side view of the optical package 200, as depicted with reference to FIG. 3. As illustrated, the substrate 300 of the optical package connection includes the recessed portions on an opposed end. However, along a top surface of the optical package 200, a cap 210 is coupled to this top surface in order to encapsulate a plurality of optical electrical components, which are further illustrated with reference to FIG. 7. As illustrated with reference to FIG. 3, by utilizing a recessed backsided optical package connection, spaces saved for the optical electronic components, which are coupled to a top surface of the substrate 300, without sacrificing RF performance.

Figure 5:
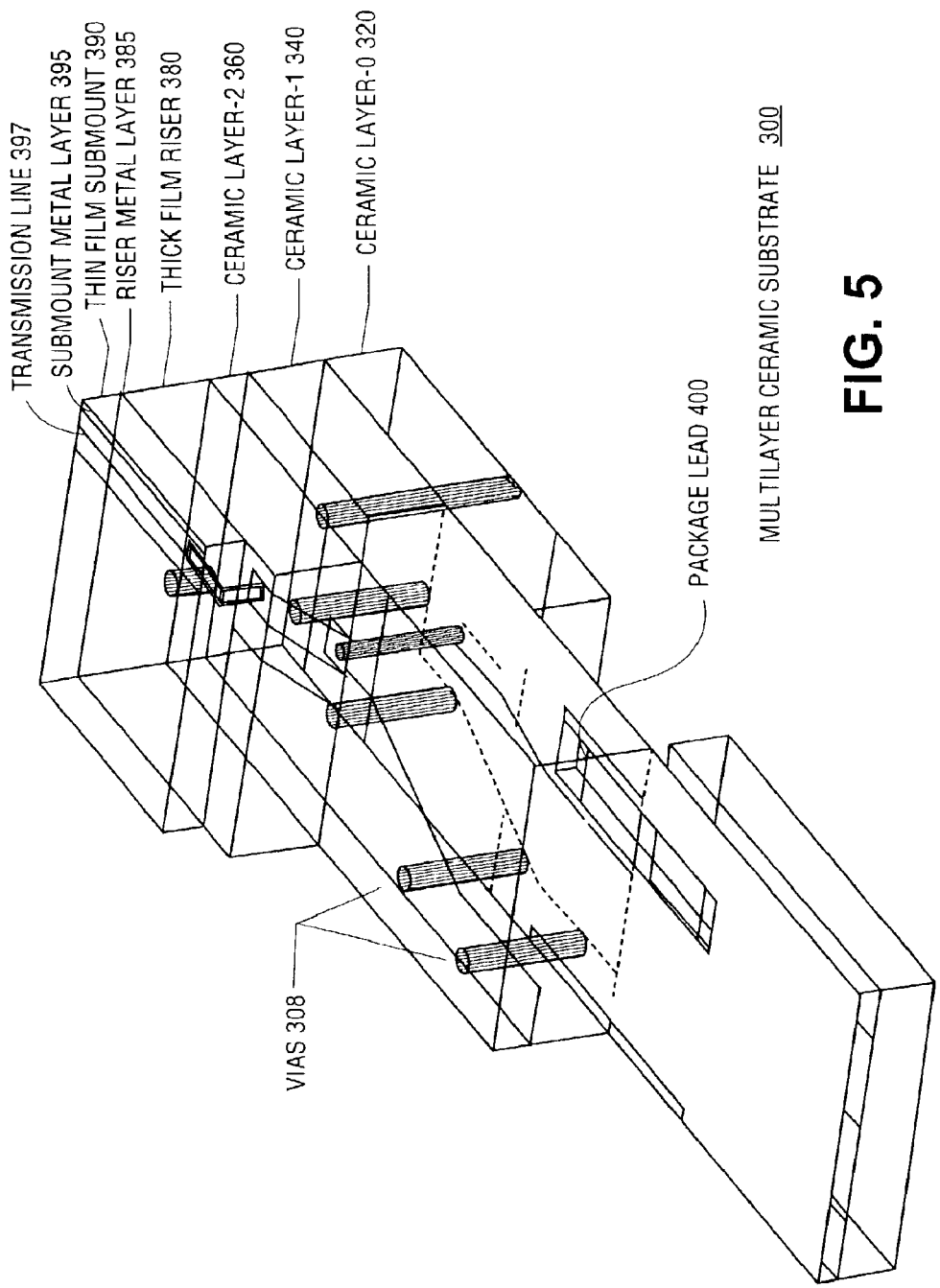
FIG. 5 depicts a 3D simulation of a multi-layer ceramic substrate utilized within an optical package connection in accordance with a further embodiment of the present invention.

Referring now to FIG. 5, FIG. 5 further illustrates the multilayer ceramic 300 of the optical package 200, as depicted in FIGS. 3 and 4. In the embodiment depicted with reference to FIG. 5, the multilayer ceramic includes three layers: ceramic layer zero 320, ceramic layer one 340 and ceramic layer two 360. In the embodiment depicted, the various ceramic layers are coupled together utilizing a plurality of vias 308. Although the multilayer substrate is depicted utilizing three ceramic layers, those skilled in the art will recognize that various combinations of layers may be utilized while remaining within the scope of embodiments of the present invention.

As further illustrated, the multilayer ceramic 300 includes a thick film riser 380, as well as the thin film submount 390. In one embodiment, a riser metal layer 385 is provided between riser 380 and submount 390. In addition, a submount metal layer 395 is formed on a top surface of submount 390. Once formed, a patterned transmission line 397 is formed to provide a continued RF signal path to the electrical optical components, which reside on a top surface of the multilayer ceramic substrate 300. In one embodiment, the multilayer ceramic substrate 300 is a cofired, multilayer ceramic substrate.

Figure 6A:
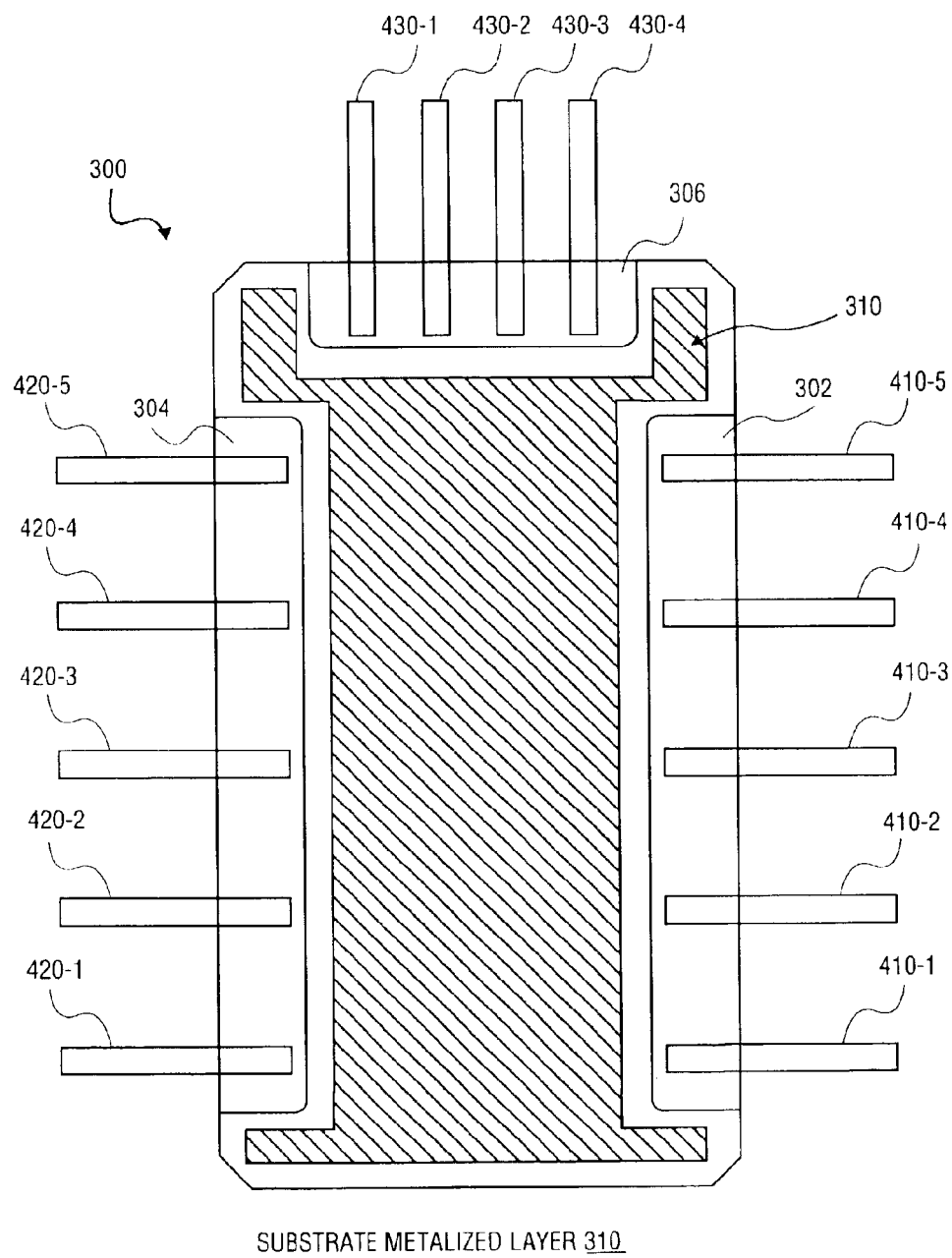
FIGS. 6A–6D depict block diagrams further illustrating metalized layers of the multilayer ceramic substrate, as depicted in FIG. 5, in accordance with further embodiments of the present invention.

Referring now to FIG. 6A, FIG. 6A depicts a block diagram illustrating ceramic layer zero 320 of a multilayer ceramic substrate 300, as depicted in FIG. 5. As depicted with reference to FIG. 6A, ceramic layer zero 320 contains a bottom surface, which is metalized in order to enable RF shielding as well as contact to a heat sink. As illustrated, the substrate metalized layer 310 is comprised of the shaded region. Adjacent to the shaded region, the recessed portions of the substrate enable coupling of the plurality of leads of the lead frame 400.

As illustrated, ceramic layer zero 320 includes opposed recessed portions 302 and 304, as well as adjacent recessed portion 306. Although the ceramic layer 320 is illustrated with opposed recessed portions and an adjacent portion 306, those skilled in the art will recognize that various techniques for selecting portions for recessing of the bottom ceramic layer 320 may be made while remaining within the scope of the embodiments of the present invention. As such, a surface of the bottom ceramic layer 320 is metalized to form substrate metalized layer 310 in order to provide RF shielding as well as enabling contact to a heat sink. Consequently, by utilizing a recessed package configuration, the substrate metalized layer 310 is flat, which provides improved thermal dissipation.

Figure 6B:
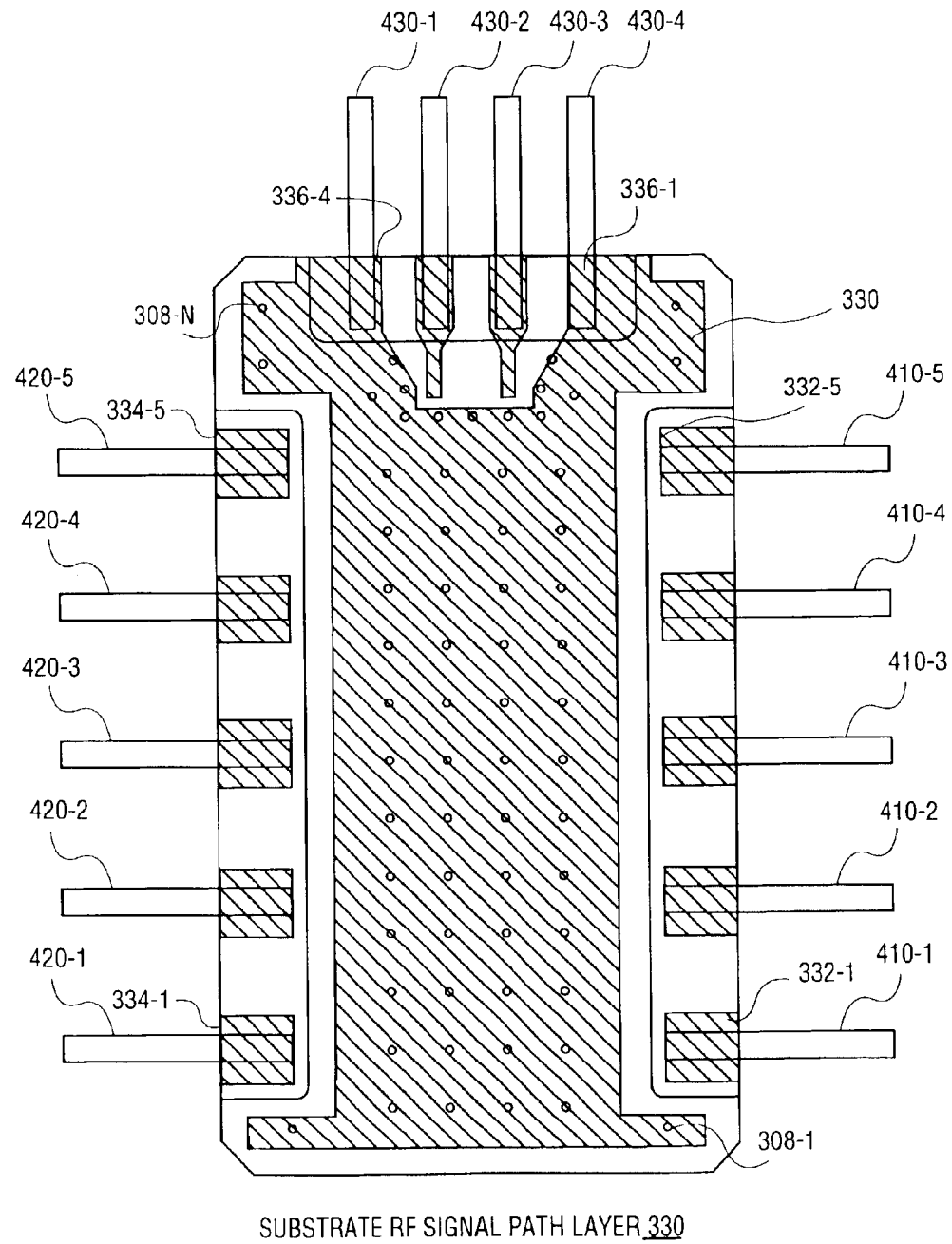

Referring now to FIG. 6B, FIG. 6B further illustrates bottom ceramic layer 320, as illustrated with reference to FIGS. 5 and 6A. As depicted with reference to FIG. 6B, FIG. 6B illustrates an RF signal path layer 330 of the bottom ceramic layer 320. Accordingly, the bottom ceramic layer 320 is metalized to provide an RF signal path from leads 430 (430-1, . . . , 430-4) to an interior of the substrate. In this embodiment, layer 330 includes a plurality of pads (332, 334 and 336) which are utilized to couple to the leads of a lead frame. In addition, the bottom ceramic layer 320 is instrumented with a plurality of vias in order to couple the RF signal path layer 330 to the metalized substrate layer 310, as depicted in FIG. 6A.

Figure 6C:
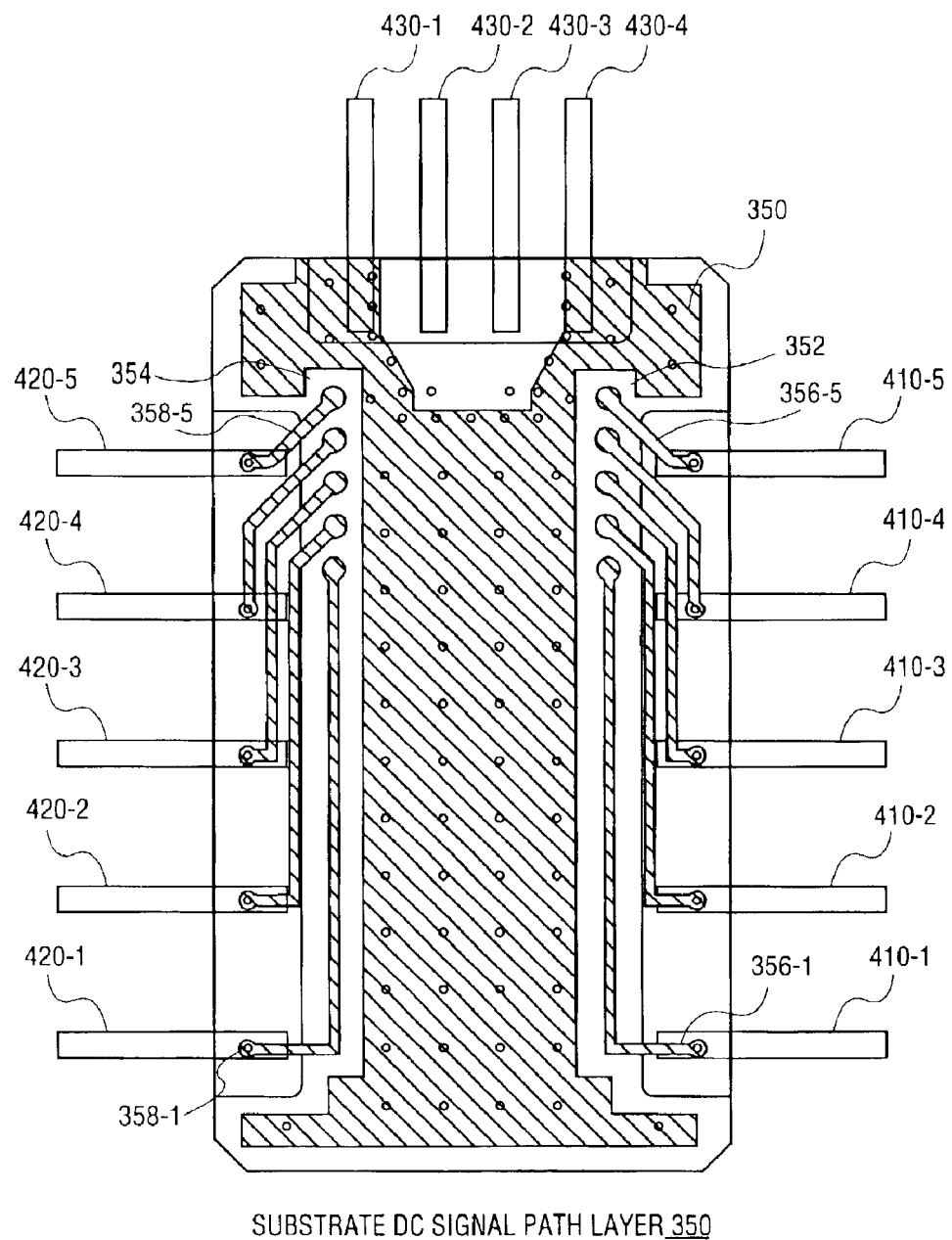

Referring now to FIG. 6C, FIG. 6C illustrates a DC signal layer 350 of the multi-level ceramic 300. As illustrated with reference to FIG. 6C, the ceramic layer-1 340 (FIG. 5) is fabricated to form the DC signal path layer 350. As illustrated, the DC signal path layer 350 provides DC signal routing from bonding pads 342 and 344 to various leads 410 and 420 coupled to opposed recessed portions 302 and 304 of the bottom (layer-0) ceramic layer 320. As illustrated, wire bonds 346 (346-1, . . . , 346-5) couple leads 410 (410-1, . . . , 410-5) of lead frame 400 to bond pad 342. Likewise, bond pad 344 of the DC signal path layer 340 is coupled to the leads 420 (420-1, . . . , 420-5) of lead frame 400 by wire bonds 348 (348-1, . . . , 348-5).

Accordingly, in one embodiment, ceramic layer-0 320 is fabricated to form the metalized layer 310 (FIG. 6A) and RF signal path layer 330 (FIG. 6B). Likewise, a top surface of ceramic layer-1 340 is fabricated to form the DC signal path layer 350 to the leads of lead frame 400. In addition, a top surface of ceramic layer-2 360 (FIG. 5) is fabricated to form a top surface metal layer 370. Once each of the ceramic layers are metalized, the ceramic layers are cofired together to form the multilayer ceramic substrate 300, as depicted in FIG. 5.

As illustrated with reference to FIG. 6D, the substrate top surface metal layer 370 provides a final signal path for the RF signal path, as well as the DC signal path, utilizing bond pads 372, 374 and 376. Accordingly, the substrate top surface metal layer 370 enables formation of optoelectronic components onto a top surface of the substrate 300. As illustrated with reference to FIGS. 5 and 7, a vertical transmission line 540, patterned onto the thick film riser 380, as well as a transmission line 397, patterned onto a metal layer 395 of thin film submount 390, are utilized to provide a signal path from the RF signal pads 376 of the substrate top surface metal layer 370 to the optical electrical components, which are mounted on top of the submount metal layer 395 (FIG. 5).

Figure 7:
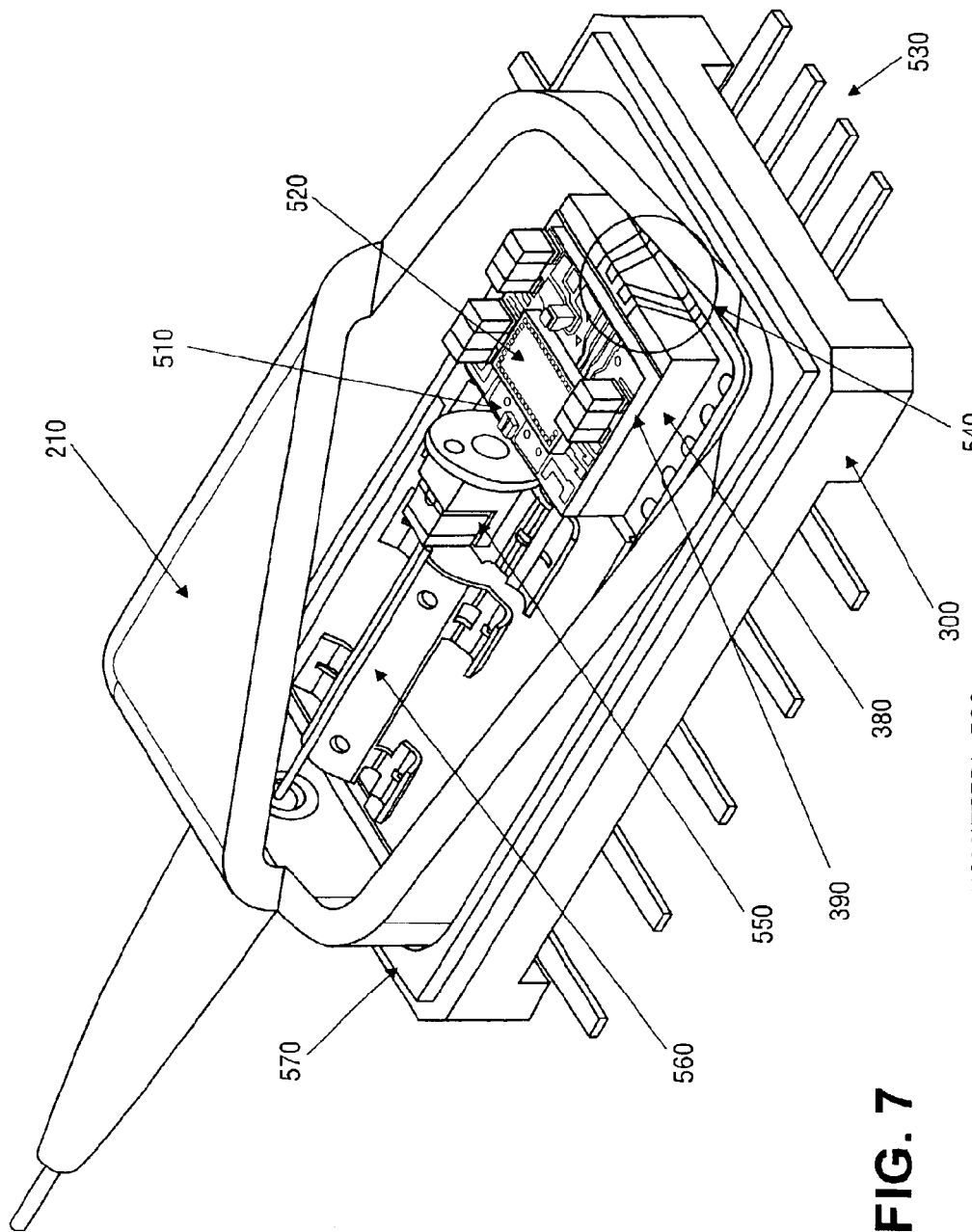
FIG. 7 depicts a block diagram illustrating an optical transmitter fabricated utilizing a recessed backside optical package connection in accordance with one embodiment of the present invention.

Referring now to FIG. 7, FIG. 7 depicts a block diagram illustrating an optical transmitter 500 configured utilizing a recessed, backside optical package configuration in accordance with one embodiment of the present invention. As illustrated, the transmitter 500 is configured with a backside recessed substrate 300 for coupling the leads of a lead frame in order to provide an electrical connection for the optical package. Accordingly, the transmitter 500, as depicted with reference to FIG. 7, increases the space available for optoelectronic components on the top surface of the transmitter 500, while providing a flat surface on the backside of the package for good thermal dissipation. In addition, the optical package configuration eliminates the need for coaxial connection resulting in increased system space.

As illustrated, the transmitter 500 includes lid cap 210, which is coupled to a top surface of substrate 300. A riser 380, as well as submount 390, are further coupled to a top surface of the substrate 300. Once coupled, the riser 380 and submount 390 enable a vertical transmission line 540 to provide signal paths for RF interface 530. The transmitter 500 further includes electro optic component 510, which in the embodiment depicted is a laser diode. In addition, the optoelectronic components include electrical integrated circuit 520, which in the embodiment depicted is a driver.

To provide the optical transmission, the transmitter 500 further includes an optical component 550, which in the embodiment depicted, is illustrated as the isolator, which transmits optical signals using fiber/flexure 560. In an alternate embodiment, the optic-electric components form a semi-conductor laser for transmission of the optical signals. Conversely, the transmitter 500 is converted into a receiver by utilizing a semiconductor detector as the optoelectronic components and a transimpedance amplifier as electrical IC 520. Accordingly, the backside recessed portion of the transmitter 500 enables an electronic connection for the optical package in order to transduce electrical signals into optical signals and transmit the optical signals via fiber 560.

Figure 8:
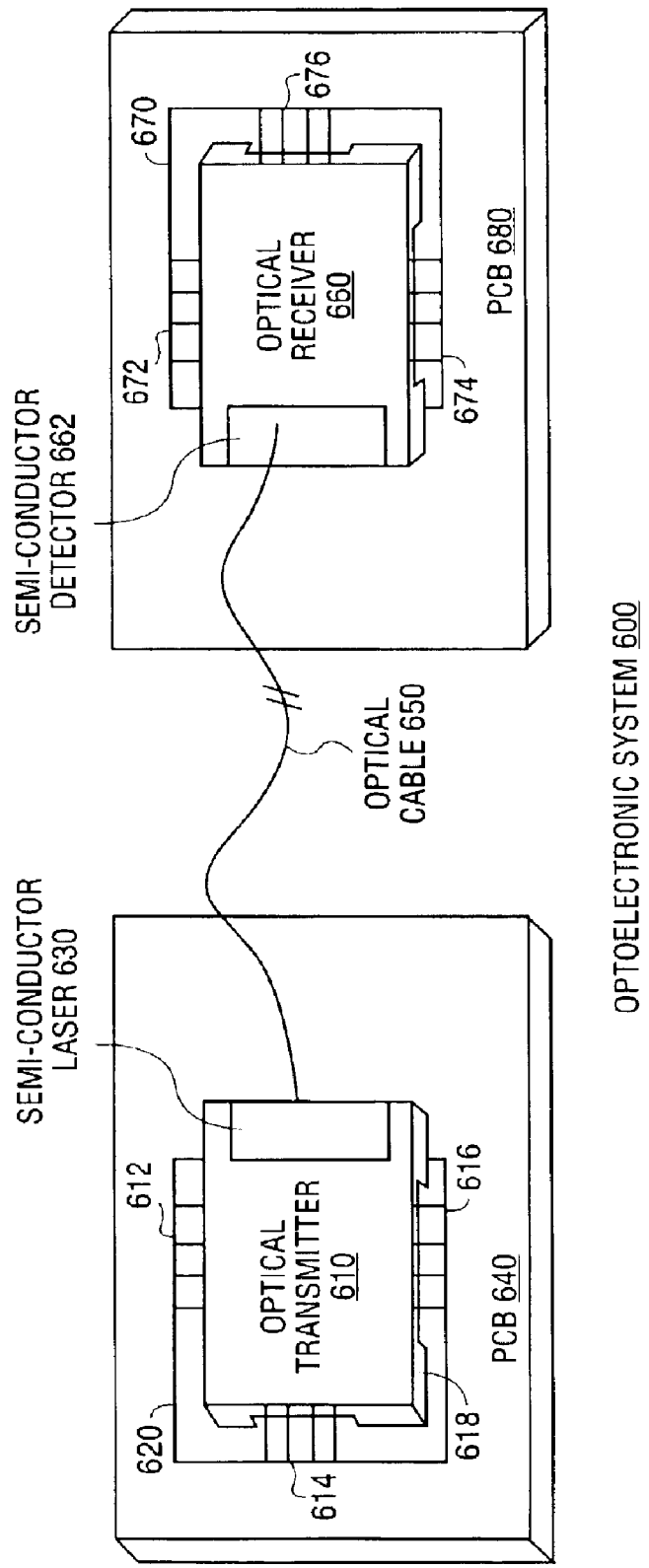
FIG. 8 depicts a block diagram illustrating an optoelectronic system utilizing recessed optical package connections in accordance with a further embodiment of the present invention.

Referring now to FIG. 8, FIG. 8 illustrates a block diagram depicting an optical electronic system 600, utilizing optical packages configured with a recessed backside portion to provide an electronic connection within an optical system. As illustrated, the system 600 includes an optical transmitter 610, for example as depicted with reference to FIG. 7. The optical transmitter 610 includes a backside recessed substrate 618 for enabling coupling of a plurality of leads of a lead frame 620. As such, the optical transmitter 610 is coupled to printed circuit board 640 via lead frame 620. Utilizing this connection, the optical transmitter 610 increases the space available for optoelectronic components on a top surface of substrate 620, while providing a flat surface on the backside of the package for good thermal dissipation.

In one embodiment, installation of package 660 may be done by a service mount technique or via a connector or socket to form the transmitter. As illustrated, the optical package 610 is configured as a transmitter, which includes semiconductor laser 630. In the embodiment depicted, the semiconductor laser 630 functions as an I/O section, which enables transmission of optical signals generated from electrical signals provided from PCB 640 via lead frame 620. As such, the optical transmitter 610 communicates via semiconductor laser 630, while transmitting optical signals via optical cable 650. The optical signals are received by optical receivers 660.

As illustrated, optical receiver 660 is installed onto PCB 680 via lead frame 670. In one embodiment, illustration of optical package 660 may be done via a service mount technique or via a connector or socket. As such, the optical package 660 is configured as an optical receiver, which utilizes a lead frame 670 in order to form an electrical connection to PCB 680 while increasing the space available for optical electronic components coupled to a top surface of the optical package substrate. In order to receive optical signals, optical receiver 660 includes a semiconductor detector 662. The semiconductor detector 662 receives an optical signal from optical cable 650 and converts the optical signal into its original electrical signal format.

As such, the optoelectronic system 600 utilizes optical package connections that contain a backside recessed portion for coupling of the leads to the lead frame. This configuration reduces the space required for attaching to the lead frame, while eliminating the need for coaxial connections. In addition, using a backside recessed optical package connection, optical transmitters 610 and optical receivers 660 increase the space available for mounting optoelectronic components onto a surface of the substrates of the various packages without sacrificing RF performance. Procedural methods for implementing and fabricating various embodiments of the present invention are now described.

Optical Package Fabrication

Figure 9:
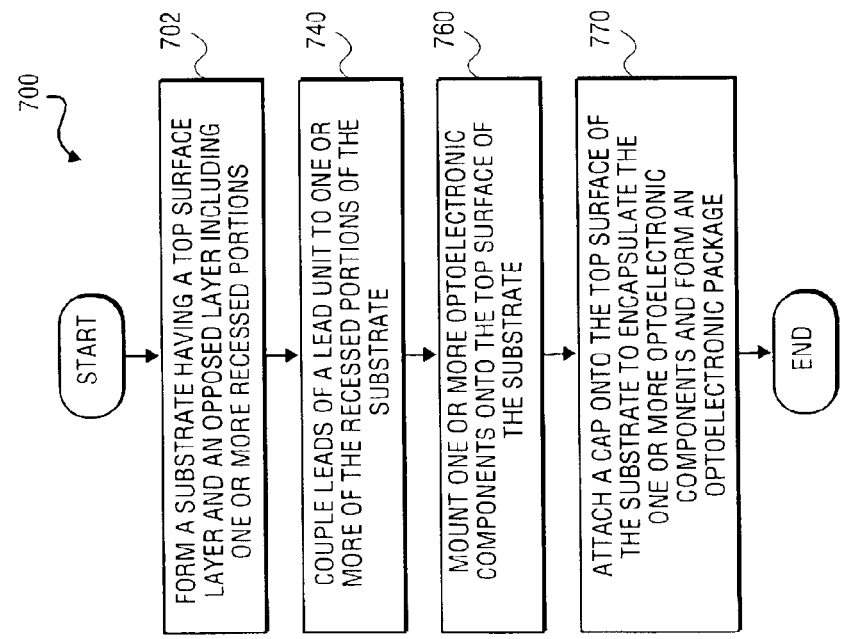
FIG. 9 depicts a flowchart illustrating a method for fabricating a backside recessed optical package connection in accordance with one embodiment of the present invention.

Referring now to FIG. 9, FIG. 9 depicts a flowchart illustrating a method 700 to form a backsided and recessed optical package connection, for example as depicted with reference to FIGS. 3–7. At process block 702, a substrate is formed having a top surface and an opposed layer including one or more recessed portions, for example, as depicted with reference to FIG. 6A. As illustrated with reference to FIG. 6A, ceramic layer 320 includes opposed recessed portions 302 and 304 with adjacent recessed portion 306 to enable coupling of the leads of a lead frame 400. Once the substrate is formed, at process block 740, the leads of a lead unit are coupled to one or more of the recessed portions of the substrate 300. As illustrated with reference to FIGS. 3 and 6A, the lead unit, according to one embodiment of the present invention, is configured as lead frame 300.

As described above, the lead frame 300 includes a plurality of opposed leads 410 and 420, as well as adjacent leads 430. As such, in one embodiment, the adjacent leads and opposed leads are coupled to bond pads of substrate RF signal path layer 330, as depicted with reference to FIG. 6B. Once the lead frame is attached to the substrate 300, one or more optoelectronic components are mounted onto a top surface of the substrate 300. Consequently, the package provides a planar surface for forming optical package assemblies utilizing circuit fabrication techniques, such as machine vision.

Figure 6D:
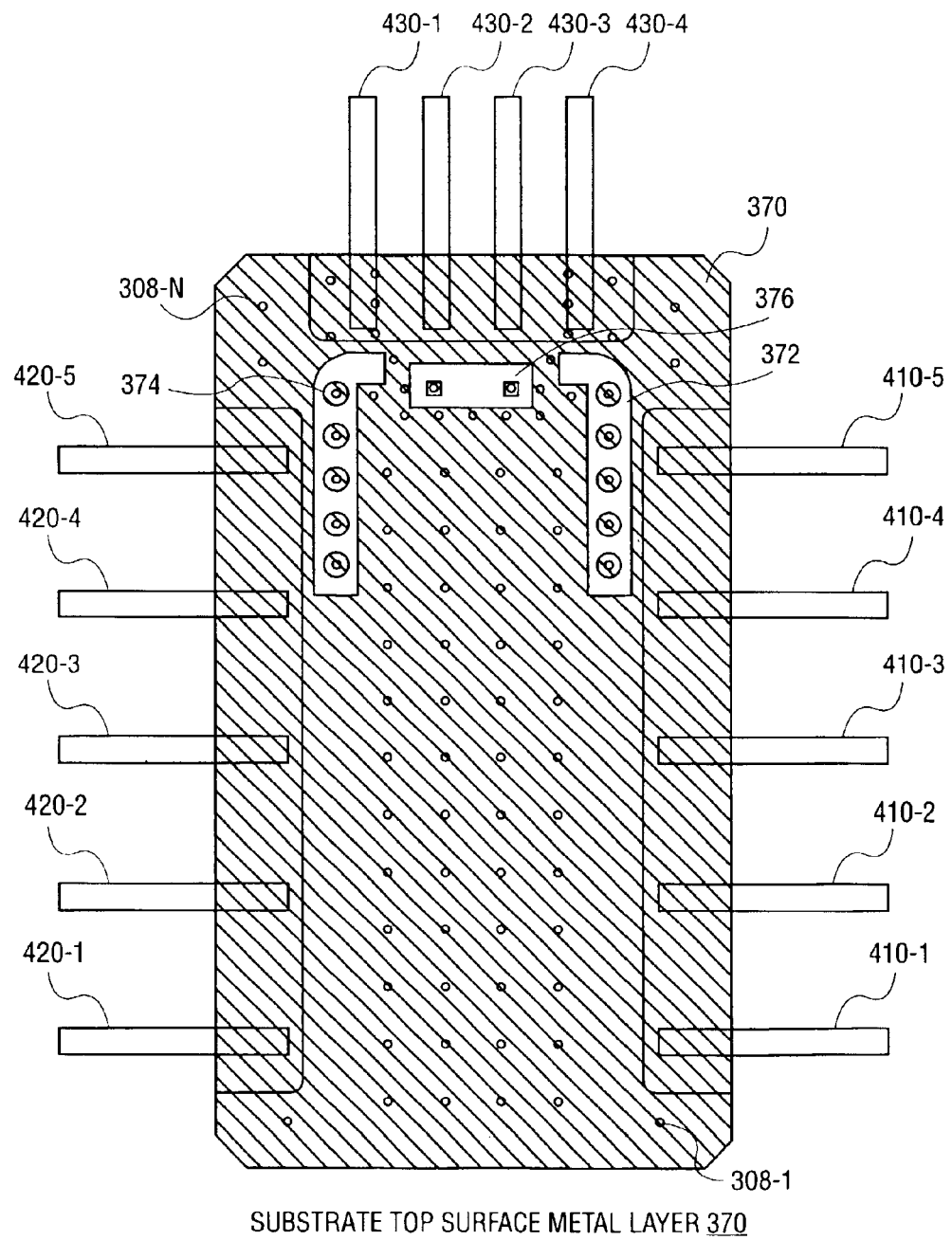

In one embodiment, the top surface of the substrate refers to substrate top surface metal layer 370, as depicted in FIG. 6D. The optoelectronic components which may be mounted onto the top surface metal layer 300 include, for example, optical component isolators, electrical IC drivers, laser diodes, light emitting diodes, semiconductor lasers, optical elements, optical sub-assemblies, as well as semiconductor detectors, for example, as depicted with reference to FIG. 7. Finally, at process block 770, a cap is attached to a top surface of the substrate 300 to encapsulate the one or more optoelectronic components and form an optoelectronic package, for example, as depicted with reference to FIG. 7.

Figure 10:
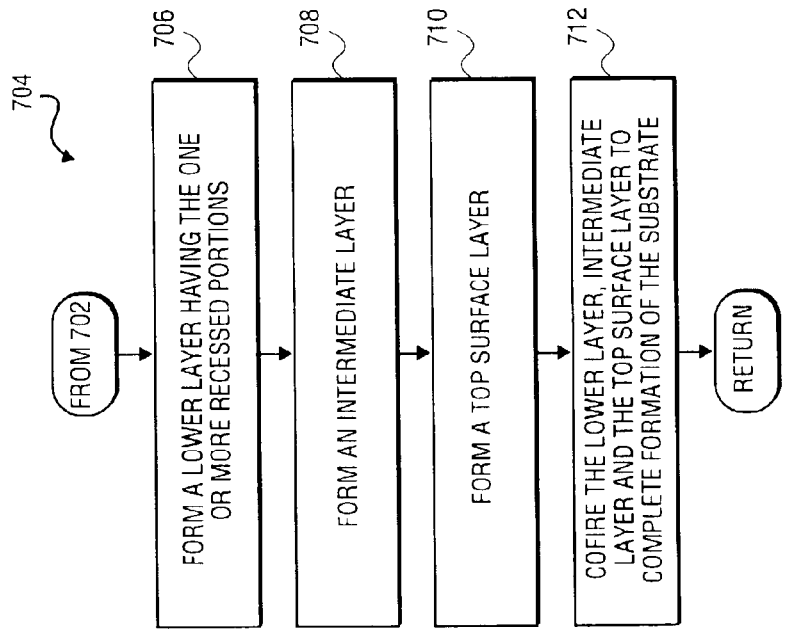
FIG. 10 depicts a flowchart illustrating an additional method for forming a multilayer ceramic having one or more recessed portions in accordance with the further embodiment of the present invention.

Referring now to FIG. 10, FIG. 10 depicts a flowchart illustrating an additional method 704 for forming a backside recessed substrate of process block 702, as depicted with reference to FIG. 9. At process block 706, a lower layer is formed having one or more recessed portions, for example, as depicted with reference to FIGS. 5 and 6A. At process block 708, an intermediate layer is formed, for example, as depicted with reference to FIG. 5. At process block 710, a top surface layer is formed. Finally, at process block 712, the lower, intermediate and top layers are cofired together to complete formation of substrate 300, as depicted with reference to FIG. 5. Although substrate 300 is illustrated with three layers, generally, the substrate 300 includes at least two layers.

Figure 11:
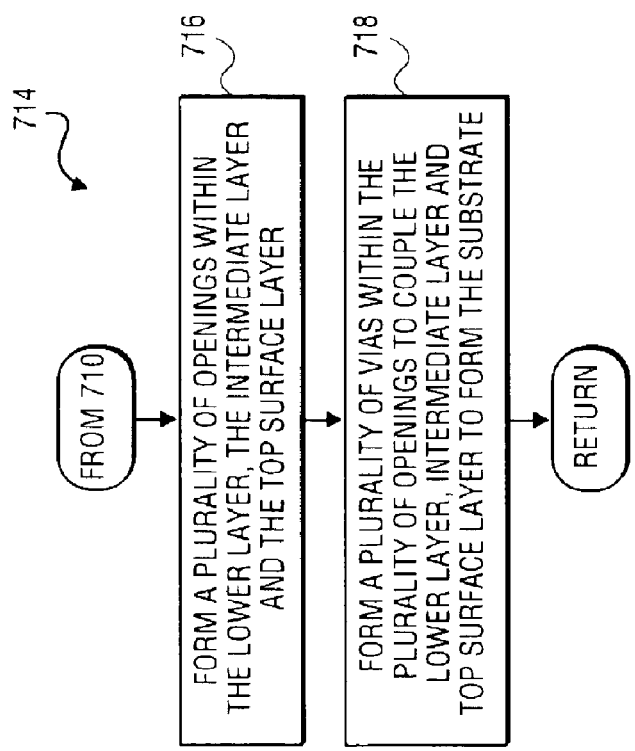
FIG. 11 depicts a flowchart illustrating an additional method for coupling the layers of the multilayer ceramic in accordance with a further embodiment of the present invention.

Referring now to FIG. 11, FIG. 11 depicts a flowchart illustrating an additional method 714 to enable coupling of the multilayer ceramic substrate 300, for example, as depicted with reference to FIG. 5. At process block 716, a plurality of openings are formed within the lower layer, intermediate layer and top surface layer of substrate 300. Once formed, at process block 718, a plurality of vias are formed within the plurality of openings to couple the lower layer, intermediate layer and top surface layer to form the substrate. In one embodiment, this is performed by generating openings within each of the multilayers of the multilayer ceramic substrate 300 and depositing metal within the openings in order to form vias for coupling the ceramic layers, for example, as utilized when forming printed circuit boards.

Figure 12:
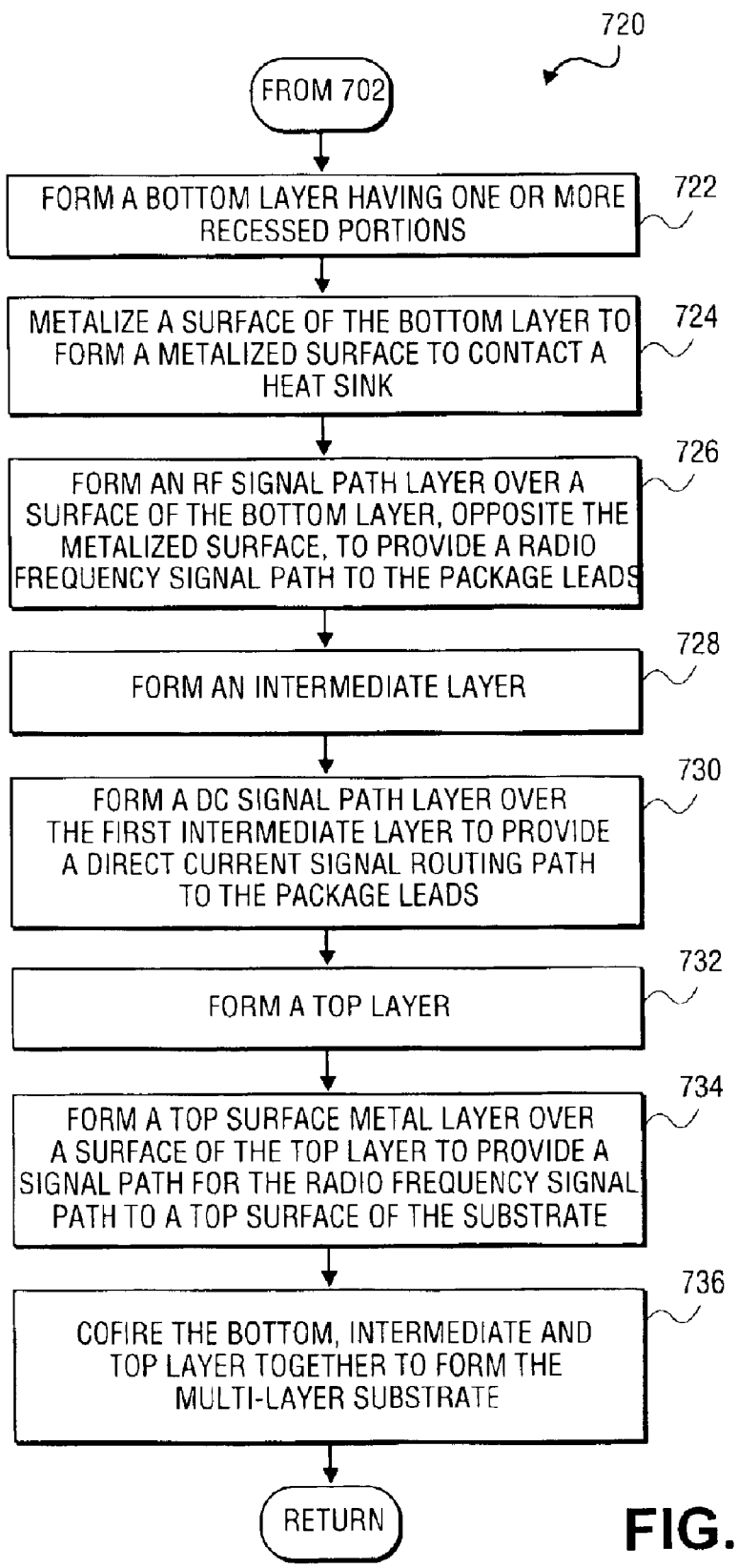
FIG. 12 depicts a flowchart illustrating an additional method for forming a multilayer ceramic substrate having one or more recessed portions and one or more metalized layers in accordance with a further embodiment of the present invention.

Referring now to FIG. 12, FIG. 12 depicts a flowchart illustrating an additional method 720 for forming the multilayer ceramic substrate 300 of process block 702, as depicted with reference to FIG. 9. At process block 722, a bottom layer 320 is formed having one or more recessed portions, for example, as depicted with reference to FIG. 6A. Once formed, at process block 724, a surface of bottom ceramic layer 320 is metalized in order to form a metalized layer 610 to provide RF shielding, as well as enabling contact to a heat sink. Following forming of the substrate metalized layer 610, at process block 726, an RF signal path layer 330 is formed on an opposed surface of the substrate metalized layer 310 to complete formation of bottom ceramic layer 320.

In one embodiment, substrate RF signal path layer 330 provides bond pads for coupling of the various leads of lead frame 400, for example, as illustrated with reference to FIG. 6B. At process block 728, an intermediate ceramic layer 340 is formed. Once formed, at process block 730, a DC signal path layer 350 is formed over intermediate ceramic layer 340. In one embodiment, the DC signal path layer 350 provides a DC signal path from bond pads to the leads of lead frame 400 utilizing wire bonds 356 and 358, for example, as depicted with reference to FIG. 6C. At process block 732, a final ceramic (top) layer is formed, for example, as depicted with reference to FIGS. 5 and 6D.

Once the top layer is formed, at process block 734, a substrate top surface metal layer 370 is formed over the top ceramic layer 360. In one embodiment, the substrate top surface metal layer 370 enables a signal path between RF signal path layer 330, as well as DC signal path layer 350, utilizing bond pads 372, 374 and 376. Finally, once each of the ceramic layers are formed, the layers are cofired together to form the multilayer ceramic substrate 300. As such, the multilayer ceramic provides an electrical signal path between the plurality of leads of the lead frame 400 to the optoelectronic components which are mounted onto the surface of the substrate 300. As illustrated with reference to FIGS. 6A–6D, the RF signal path layer 330 is fabricated to include a plurality of vias 308, which couple the RF signal path layer through the substrate top surface metal layer 370 in order to enable formation of substrate 300.

Figure 13:
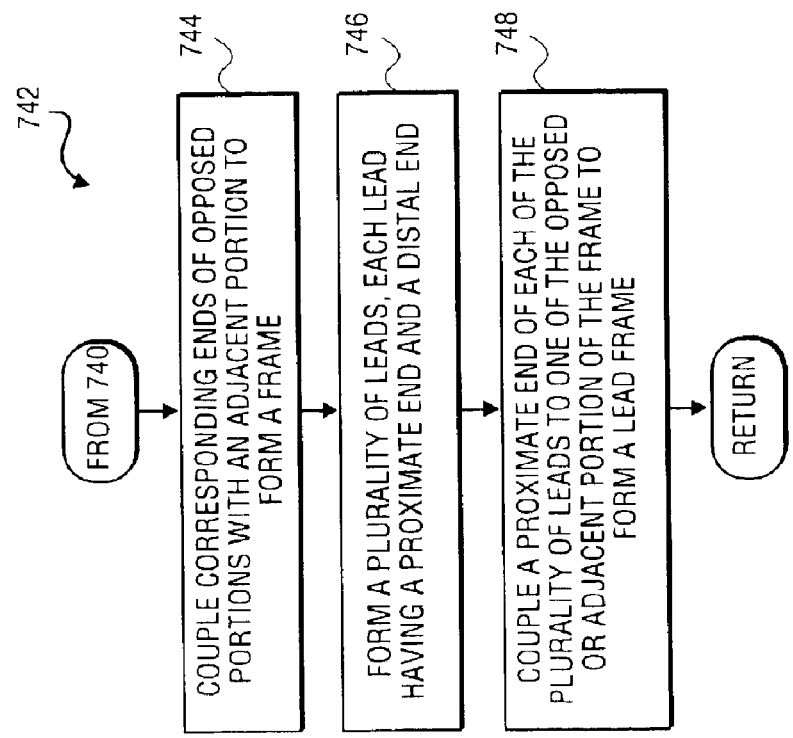
FIG. 13 depicts a flowchart illustrating an additional method for coupling a lead frame within recessed portions of a multilayer ceramic substrate in accordance with a further embodiment of the present invention.

Referring now to FIG. 13, FIG. 13 depicts a flowchart illustrating a method 742 for forming a lead frame. At process block 744, corresponding ends of opposed portions are coupled together with an adjacent portion to form a frame, for example, as depicted with reference to FIGS. 3 and 4. Once coupled together, a plurality of leads are formed. Each lead includes a proximate end and a distal end. Finally, at process block 748, a proximate end of each of the plurality of leads is coupled to either an opposed portion of the frame or an adjacent portion of the frame to form a lead frame 400, as depicted with reference to FIGS. 3 and 4.

As is recognized by those skilled in the art, the configuration of lead frame 400 may be modified while remaining within the scope of the present invention in order to enable various configurations outside the example embodiments described with the reference to the present invention based on the configuration of the recessed portions of the substrate 300. In addition, various configurations of the substrate are possible while remaining within the scope of the invention claims. In addition, the various substrate layers may be attached together by various means while remaining within the scope of the invention claims.

Figure 14:
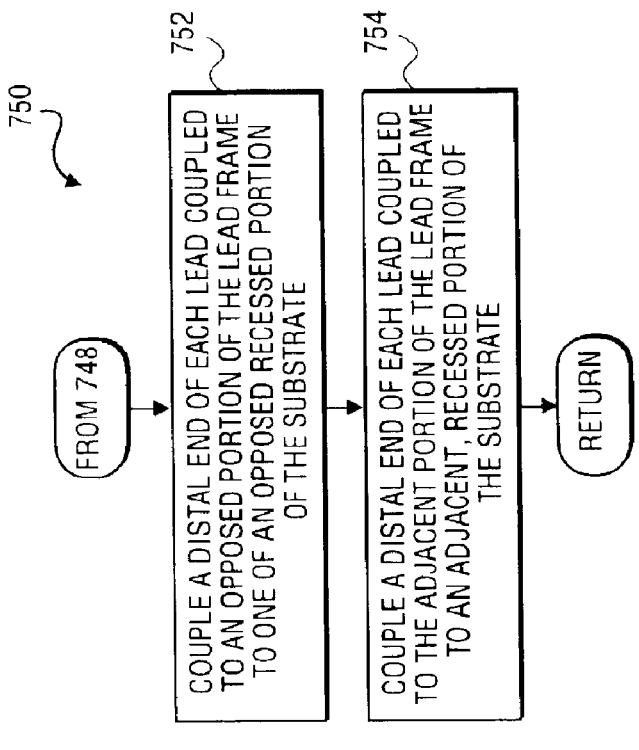
FIG. 14 depicts a flowchart illustrating an additional method for coupling a lead frame to one or more recessed portions of a multilayer ceramic substrate in order to form an optical package connection in accordance with an exemplary embodiment of the present invention.

Finally, referring to FIG. 14, FIG. 14 depicts a flowchart illustrating an additional method for coupling the leads of a lead frame of process block 740, as depicted with reference to FIG. 9. At process block 752, a distal end of each lead coupled to an opposed portion of the lead frame is coupled to one of the opposed recessed portions of substrate 300. For example, as depicted with reference to FIG. 6A, leads 410 and 420 are coupled to opposed portions of lead frame 400 via their proximate ends. As such, these leads are coupled via their distal ends of opposed recessed portions of substrate 300. As illustrated in FIG. 3A, the opposed portions refer to portions 302 and 304.

In one embodiment, the leads of the lead frame are coupled to RF signal path layer 330 via bond pads 332 and 334. Finally, at process block 754, a distal end of each lead coupled to the adjacent portion of lead frame 400 is coupled to an adjacent recessed portion of substrate 300. As depicted with reference to FIGS. 6A and 6B, leads 430 are coupled to an adjacent portion of lead frame 400. Accordingly, distal ends of each lead are coupled to adjacent recessed portion 306 of substrate 300. For example, as depicted with reference to FIG. 6B, lead frames are coupled to bond pads 306 of RF signal path layer 330.

As such, utilizing a multilayer ceramic having a backside recessed portion, an optical package may be fabricated which utilizes a lead frame coupled to recessed portions of the substrate. In doing so, the amount of space required for a package connection to the lead frame is reduced. In addition, such a configuration increases the space available for placing and mounting optoelectronic components onto a top surface of the substrate to form optical package assemblies, such as transponders, transducers, optical transceivers and receivers. In addition, the recessed portion provides an improved thermal conductor path, while boosting RF communication signals.

Alternate Embodiments

Several aspects of one implementation of the backsided and recessed optical package connection for providing a planar platform for optical assembly have been described. However, various implementations of the backsided and recessed optical package connection provide numerous features including, complementing, supplementing, and/or replacing the features described above. Features can be implemented as part of the optical package or as part of an optical system to PCB connection in different implementations. In addition, the foregoing description, for purposes of explanation, used specific nomenclature to provide a thorough understanding of embodiments of the invention. However, it will be apparent to one skilled in the art that the specific details are not required in order to practice embodiments of the invention.

In addition, although an embodiment described herein is directed to a backsided and recessed optical package connection, it will be appreciated by those skilled in the art that the embodiment of the present invention can be applied to other systems. In fact, systems for planar optical package connections are within the embodiments of the present invention, without departing from the scope and spirit of the present invention. The embodiments described above were chosen and described in order to best explain the principles of the invention and its practical applications. These embodiment were chosen to thereby enable others skilled in the art to best utilize the invention and various embodiments with various modifications as are suited to the particular use contemplated.

It is to be understood that even though numerous characteristics and advantages of various embodiments of the present invention have been set forth in the foregoing description, together with details of the structure and function of various embodiments of the invention, this disclosure is illustrative only. In some cases, certain subassemblies are only described in detail with one such embodiment. Nevertheless, it is recognized and intended that such subassemblies may be used in other embodiments of the invention. Changes may be made in detail, especially matters of structure and management of parts within the principles of the embodiments of the present invention to the full extent indicated by the broad general meaning of the terms in which the appended claims are expressed.

The embodiments of the present invention provide many advantages over known techniques. The embodiments of the present invention include the ability to provide a planar optical package performing optical assemblies. The optical package includes a multilayer ceramic having one or more recessed portions for attaching the leads of a lead frame. As a result, the optical package connection reduces the space taken by the leads relative to the optical/electrical components of the mini optical module. In addition, the backside of the optical package is used as a thermal conductor path, providing improved radio frequency performance. In addition, by eliminating coaxial connections, space is saved for mounting components to the system, such as for example, a transponder.

Having disclosed exemplary embodiments, modifications and variations may be made to the disclosed embodiments while remaining within the scope of the embodiments of the invention as defined by the following claims.

What is claimed is:

1. An apparatus composing:

a substrate;

one or more optoelectronic components mounted onto a tap surface of the substrate;

a cap coupled to the top surface of the substrate to enclose the one or more optoelectronic components; and a lead unit having a plurality of leads coupled to one or more recessed portions of one of an intermediate layer and a bottom layer of the substrate.

2. The apparatus of claim 1, wherein the substrate comprises a multilayer cofired ceramic having a recessed intermediate layer to enable coupling of the leads of the lead unit.

3. The apparatus of claim 2, wherein he multilayer cofired ceramic is comprised of one of alumina and aluminum nitride.

4. The apparatus of claim 1, wherein the substrate comprises:
- a recessed bottom layer having one or more recessed portions to enable coupling of the leads of the lead unit, the intermediate layer coupled onto the bottom layer with a plurality of vias; and
- a top layer coupled onto the intermediate layer with the plurality of vias to form the substrate.

5. The apparatus of claim 4, wherein the recessed bottom layer of the substrate is comprised of a pair of opposed recessed portions and an adjacent portion to couple to leads of the lead unit, the recessed bottom layer having a metalized layer to contact a heat sink and an opposed layer to provide a radio frequency signal path from leads coupled to the adjacent recessed portion of the recessed bottom layer to an interior portion of the substrate.

6. The apparatus of claim 1, wherein the optoelectronic components comprise one of electrical integrated circuits, and optics including one of a semiconductor and a semiconductor detector.

7. The apparatus of claim 1, wherein the optoelectronic components comprise one of a laser diode, a light emitting diode, an optical fiber, a photodiode and a photodetector.

8. The apparatus of claim 1, wherein the lead unit comprises:
- a frame having a pair of opposed portions coupled together with an adjacent portion; and
- a plurality of leads, each lead having a proximate end coupled to one of an opposed portion of the frame and the adjacent portion of the frame to form a lead frame as the lead unit, each lead including a distal end to couple to a recessed portion of the substrate.

9. The apparatus of claim 1, wherein the substrate further comprises:
- a recessed bottom layer having opposed recessed portions and an adjacent recessed portion, the recessed bottom layer also having a metalized surface to provide RF shielding and contact a heat sink, and an opposed radio frequency (RF) signal path layer to provide a radio frequency signal path from leads coupled to the adjacent recessed portion of the bottom layer to an interior of the apparatus, the intermediate layer covering the RF signal path layer of the recessed bottom layer, opposite the metalized surface;
- a direct current (DC) signal path layer covering the intermediate layer and including a pair of bond pads to provide a direct current signal routing from the bonding pads to leads coupled to the opposed portions of die recessed bottom layer;
- a top layer covering the DC signal path layer of the intermediate layer; and
- a top surface metalized layer covering the top layer to provide a signal path for a radio frequency signal path and the direct current signal path from the leads to a top surface of the substrate.

10. The apparatus of claim 9, wherein the bottom layer, the first and second intermediate layers and the top layer arc coupled together with a plurality of vias.

11. A system comprising:
- a printed circuit board; and
- an optical package being operatively installed on the printed circuit board, the package including a substrate having a top layer to enable coupling of one or more optoelectronic components onto a surface of the substrate, an intermediate layer coupled to the top layer and bottom layer, the bottom layer having one or more recessed portion to couple leads of a lead frame to enable communication with the printed circuit board.

12. The system of claim 11, wherein the optoelectronic components comprise one of a laser diode, a photodetector, and an electrical integrated circuit.

13. The system of claim 11, wherein the substrate is a multilayer cofired ceramic composed of one of alumina and aluminum nitride.

14. The system of claim 11, wherein the optoelectronic components comprised one of a semiconductor laser and a semiconductor detector.

15. The system of claim 11, wherein the substrate comprises:
- a recessed bottom layer having one or more recessed portions to enable coupling of the leads of the lead unit, the intermediate layer coupled onto the bottom layer with a plurality of vias; and
- a top layer coupled onto the intermediate layer with the plurality of vias to form the substrate.

16. The system of claim 15, wherein the recessed bottom layer of the substrate is comprised of a pair of opposed recessed portions and an adjacent portion to couple to leads of the lead unit, the recessed bottom layer having a metalized layer to contact a heat sink and an opposed layer to provide a radio frequency signal path from leads coupled to the adjacent recessed portion of the recessed bottom layer to an interior portion of the substrate.

* * * * *

UNITED STATES PATENT AND TRADEMARK OFFICE
CERTIFICATE OF CORRECTION

PATENT NO. : 6,864,553 B2
DATED : March 8, 2005
INVENTOR(S) : Epitaux et al.

It is certified that error appears in the above-identified patent and that said Letters Patent is hereby corrected as shown below:

Column 2,
Line 27, delete "MINI-DWL" and insert -- MINI-DIL --.

Column 12,
Line 52, delete "composing" and insert -- comprising --.
Line 55, "tap" and insert -- top --.
Line 65, delete "he" and insert -- the --.

Signed and Sealed this

Seventh Day of June, 2005

JON W. DUDAS
*Director of the United States Patent and Trademark Office*